United States Patent
Yan et al.

(10) Patent No.: US 10,134,824 B2
(45) Date of Patent: Nov. 20, 2018

(54) ORGANIC LIGHT-EMITTING PIXEL INCLUDING FOUR SUB-PIXELS HAVING ADJUSTED MICROCAVITY DISTANCES

(71) Applicant: BOE TECHNOLOGY GROUP CO., LTD., Beijing (CN)

(72) Inventors: Guang Yan, Beijing (CN); Chang Yen Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/304,823

(22) PCT Filed: Sep. 15, 2015

(86) PCT No.: PCT/CN2015/089659
§ 371 (c)(1),
(2) Date: Oct. 17, 2016

(87) PCT Pub. No.: WO2017/045136
PCT Pub. Date: Mar. 23, 2017

(65) Prior Publication Data
US 2017/0271430 A1    Sep. 21, 2017

(51) Int. Cl.
*H01L 29/08* (2006.01)
*H01L 27/32* (2006.01)
*H01L 51/56* (2006.01)
*H01L 51/52* (2006.01)
*H01L 51/50* (2006.01)

(52) U.S. Cl.
CPC ........ *H01L 27/3276* (2013.01); *H01L 27/322* (2013.01); *H01L 27/3213* (2013.01);
(Continued)

(58) Field of Classification Search
CPC ............................ H01L 51/5203; H01L 51/56
See application file for complete search history.

(56) References Cited

U.S. PATENT DOCUMENTS

| 6,166,489 A | 12/2000 | Thompson et al. |
| 2009/0121239 A1 | 5/2009 | Asaki et al. |

(Continued)

FOREIGN PATENT DOCUMENTS

| CN | 101262724 A | 9/2008 |
| CN | 103839960 A | 6/2014 |

(Continued)

OTHER PUBLICATIONS

The World Intellectual Property Organization (WIPO) International Search Report for PCT/CN2015/089659 dated Jun. 20, 2016 pp. 1-5.

(Continued)

*Primary Examiner* — Matthew Gordon
(74) *Attorney, Agent, or Firm* — Anova Law Group, PLLC

(57) ABSTRACT

The present disclosure provides an organic light-emitting pixel with four subpixels formed in two groups, each group having two adjacent subpixels. The organic light-emitting pixel includes a first electrode layer formed on a substrate, including a plurality of first electrodes, each first electrode corresponding to one of the subpixels; a second electrode layer; and a first functional layer corresponding to three of the four subpixels. The first function layer is configured to adjust a distance between a first electrode and the second electrode layer. The organic light-emitting pixel also includes a light-emitting layer including a first portion and a second portion, the first portion corresponding to one of the two groups of subpixels and the second portion corresponding to another one of the two groups of subpixels, respectively.

20 Claims, 6 Drawing Sheets

(52) U.S. Cl.
CPC ...... *H01L 51/5056* (2013.01); *H01L 51/5072* (2013.01); *H01L 51/5203* (2013.01); *H01L 51/5265* (2013.01); *H01L 51/56* (2013.01); *H01L 2227/323* (2013.01); *H01L 2251/558* (2013.01)

(56) References Cited

U.S. PATENT DOCUMENTS

| | | | |
|---|---|---|---|
| 2014/0014985 A1* | 1/2014 | Sonoda | H05B 33/145 257/89 |
| 2014/0183471 A1* | 7/2014 | Heo | H01L 27/322 257/40 |
| 2015/0349033 A1 | 12/2015 | Shen et al. | |
| 2015/0349285 A1* | 12/2015 | Seo | H01L 51/5044 257/40 |
| 2017/0012230 A1 | 1/2017 | Yan | |

FOREIGN PATENT DOCUMENTS

| | | |
|---|---|---|
| CN | 104157677 A | 11/2014 |
| CN | 104617231 A | 5/2015 |
| CN | 104681736 A | 6/2015 |

OTHER PUBLICATIONS

S.R. Forrest et al. The stacked OLED (SOLED): a new type of organic device for achieving high-resolution full-color displays, Synthetic Metals, vol. 91, Issues 1, Dec. 1997, pp. 9-13.

Woo-Young So et al., 21.3: Power Efficient RGBW AMOLED Displays Incorporating Color-Down-Conversion Layers. SID Symposium Digest of Technical Papers, vol. 43, Issue 1, Jun. 2012, pp. 282-285. DOI:10.1002/j.2168-0159.2012.tb05769.x.

State Intellectual Property Office of the P.R.C (SIPO) Office Action 1 for 201580000924.4 dated Feb. 14, 2018 18 Pages (including translation).

* cited by examiner

ORGANIC LIGHT-EMITTING PIXEL INCLUDING FOUR SUB-PIXELS HAVING ADJUSTED MICROCAVITY DISTANCES

This application is a national phase entry under 35 U.S.C. § 371 of International Application No. PCT/CN2015/089659, filed on Sep. 15, 2015. The above enumerated patent application is incorporated by reference herein in its entirety.

FIELD OF THE INVENTION

The present invention generally relates to the display technologies and, more particularly, relates to an organic light-emitting pixel, a display panel and a display apparatus containing the same, and a method for forming the same.

BACKGROUND

Organic light-emitting diode (OLED) display products have been widely used in everyday life. The active-matrix organic light-emitting diode (AMOLED) display technologies enable OLED display products with lower costs, lower power consumptions, and larger sizes. In existing AMOLED technologies, there are several ways to form and pattern the organic layers. For example, the organic layers are often formed by vacuum evaporation. Shadow masks, i.e., fine metal masks (FMMs), are often used for forming or patterning subpixels or pixels. Subpixels of red (R), green (G), and blue (B) colors can be formed in certain arrangements, e.g., RGB side by side, so that a pixel in a display panel may display a full range of colors.

However, because of the demand for higher resolution, pixels or subpixels with smaller sizes are preferred in display panels, and problems in existing FMM technology may become prominent. For example, FMMs may be difficult to manufacture for smaller aperture widths. It may also be inconvenient to clean the FMMs. Additionally, in a deposition process, it may be difficult to align FMMs, and the FMMs may expand at high temperatures and/or low vacuum. These problems may cause color mixing between different pixels or subpixels in the display panel and the resolution of the display panel may be adversely affected.

Efforts have been made to improve the problems in current FMM technology. For example, microcavities may be formed between electrodes to define smaller pixels or subpixels in the AMOLED array substrate. In such array substrate, the indium tin oxide (ITO) electrode corresponding to each microcavity may be hard to etch to a desired thickness or the etching may be hard to control. As a result, cavity lengths of the microcavities may vary from design and the fabrication of the AMOLED array substrate may be difficult.

BRIEF SUMMARY OF THE DISCLOSURE

The present invention at least partially addresses the above problems in the prior art. The present disclosure provides an OLED pixel or organic light-emitting pixel with a plurality of subpixels, a display panel and a display apparatus containing the OLED pixel, and a method for forming the OLED pixel. By using the OLED pixel and method for forming the OLED pixel, the transparent ITO electrode corresponding to each microcavity may be formed to have a same thickness without additional etching process. Meanwhile, the OLED pixel may be configured to emit light of at least three colors. Fabrication difficulty can be reduced and the OLED pixel may emit light with desired color. Fabrication yield of the corresponding OLED display panel can be improved.

One aspect of the present disclosure includes an organic light-emitting pixel with four subpixels formed in two groups, each group having two adjacent subpixels. The organic light-emitting pixel includes a first electrode layer formed on a substrate, including a plurality of first electrodes, each first electrode corresponding to one of the subpixels; a second electrode layer; and a first functional layer corresponding to three of the four subpixels. The first function layer is configured to adjust a distance between a first electrode and the second electrode layer. The organic light-emitting pixel also includes a light-emitting layer with a first portion and a second portion, the first portion corresponding to one of the two groups of subpixels and the second portion corresponding to another one of the two groups of subpixels.

Optionally, the first functional layer is formed between the first electrode layer and the light-emitting layer.

Optionally, the first functional layer is a hole functional layer.

Optionally, the first functional layer is formed between the second electrode layer and the light-emitting layer.

Optionally, the first functional layer is an electron functional layer.

Optionally, the subpixel corresponding to the first functional layer includes a color conversion layer formed on the second electrode layer for converting the color of light.

Optionally, a width of the first portion of the light-emitting layer is greater than twice a width of the first electrode; and a width of the second portion of the light-emitting layer is greater than twice the width of the first electrode.

Optionally, each first electrode includes a reflective portion formed on the substrate and a transparent portion formed on the reflective portion.

Optionally, the transparent portion of each first electrode has a same thickness.

The organic light-emitting pixel further includes a second functional layer formed between the first electrode layer and the light-emitting layer, the second functional layer being one of an electron functional layer and a hole functional layer.

The organic light-emitting pixel further includes a third functional layer formed between the second electrode layer and the light-emitting layer, the third functional layer being one of an electron functional layer and a hole functional layer.

Optionally, the first portion of the light-emitting layer is configured to emit green light; the second portion of the light-emitting layer is configured to emit blue light; and the color conversion layer is configured to covert green light to red light.

Optionally, two of the subpixels corresponding to the first portion of the light-emitting layer emit green light and red light; and one of the subpixels corresponding to the second portion of the light-emitting layer corresponding to the first functional layer emits green light and one of the subpixels corresponding to the second portion of light-emitting layer not corresponding to the first functional layer emits blue light.

The organic light-emitting pixel further includes an encapsulation layer formed on the second electrode layer.

Optionally, one of the subpixels includes a color conversion layer formed on the encapsulation layer for converting a color of light emitted by a corresponding portion of the light-emitting layer to another color.

Optionally, the first electrode layer is a cathode layer and the second electrode layer is an anode layer.

Another aspect of the present disclosure further includes a method for fabricating an organic light-emitting pixel with four subpixels formed in two groups, each group having two adjacent subpixels. The method includes forming a first electrode layer on a substrate with a plurality of first electrodes, each first electrode corresponding to one of the four subpixels; and forming a first functional layer corresponding to three of the four subpixels, the first functional layer configured to adjust a distance between a first electrode and the second electrode layer. The method also includes forming a light-emitting layer with a first portion and a second portion, the first portion corresponding to one of the two groups of subpixels and the second portion corresponding another one of the two groups of subpixels; and forming a second electrode layer.

Optionally, the first functional layer is formed between the first electrode layer and the light-emitting layer.

Optionally, the first functional layer is a hole functional layer.

Optionally, the first functional layer is formed between the second electrode layer and the light-emitting layer.

Optionally, the first electrodes are formed by vacuum evaporation process followed by a patterning process and the first functional layer is formed by a vacuum evaporation process.

Optionally, the method further includes forming at least one color conversion layer on the second electrode layer for converting a color of light emitted by a corresponding portion of the light-emitting layer to light of another color.

Optionally, the method further includes forming an encapsulation layer on the second electrode layer.

Optionally, the method further includes forming a color conversion layer on the encapsulation layer to converting a color of light emitted by a corresponding portion of the light-emitting layer to light of another color.

Optionally, the first electrode layer is a cathode layer and the second electrode layer is an anode layer.

Another aspect of the present disclosure further provides a display panel, including the disclosed organic light-emitting pixel.

Another aspect of the present disclosure further provides a display apparatus, including the disclosed display panel.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

For those skilled in the art to better understand the technical solution of the invention, reference will now be made in detail to exemplary embodiments of the invention, which are illustrated in the accompanying drawings. Wherever possible, the same reference numbers will be used throughout the drawings to refer to the same or like parts.

One aspect of the present disclosure provides an OLED pixel.

Figure 1:
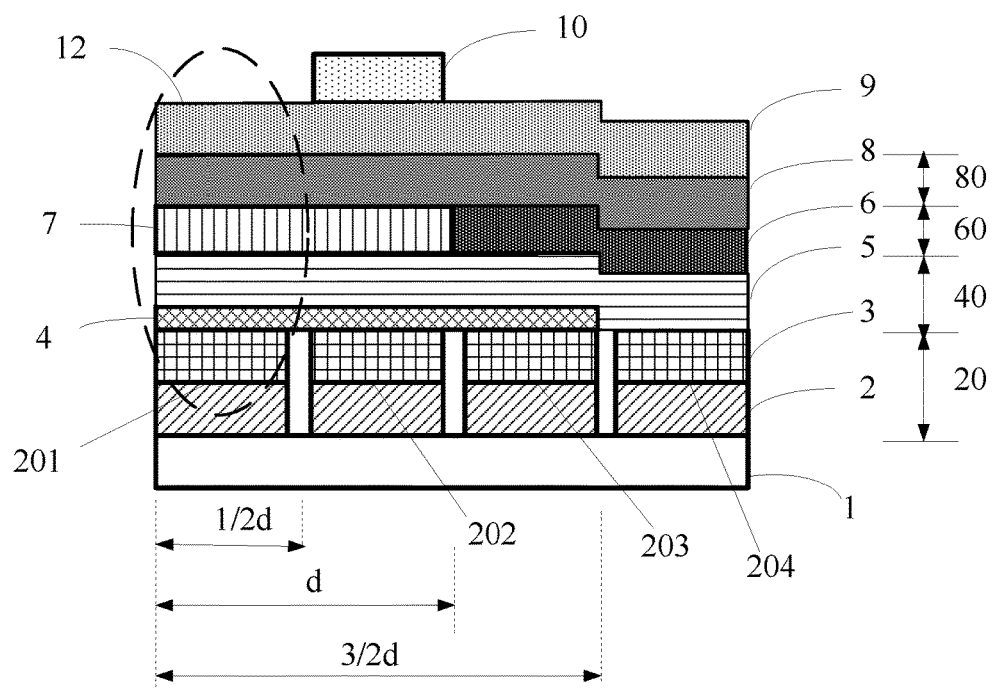
FIGS. 1 to 4 each illustrates an exemplary OLED pixel according to the disclosed embodiments of the present disclosure.

FIG. 1 illustrates an exemplary OLED pixel 100. The OLED pixel 100 may include a plurality of subpixels. The OLED pixel may enable subpixel with smaller sizes or widths to be fabricated using existing FMM technology. The OLED pixel in FIG. 1 may include a substrate 1, a first electrode layer 20, a first functional layer 40, a light-emitting layer 60, a second functional layer 80, a second electrode layer 9, and a color conversion layer 10.

In the OLED pixel, the first electrode layer 20 may be formed on the substrate 1. The first functional layer 40 may be formed on the first electrode layer 20. The light-emitting layer 60 may be formed on the first functional layer 40 and the second functional layer 80 may be formed on the light-emitting layer 60. The second electrode layer 9 may be formed on the second functional layer 80. The color conversion layer 10 may be formed on the second electrode layer 9.

The first electrode layer 20 may be the anode layer and the second electrode layer 9 may be the cathode layer, or the first electrode layer 20 may be the cathode layer and the second electrode layer 9 may be the anode layer. The first electrode layer 20 may include a reflective electrode layer 2 and a transparent electrode layer 3. The first electrode layer 20 may include a plurality of first electrodes, where each first electrode may include a reflective portion and a transparent portion on the reflective portion. In one embodiment, the first electrode layer 20 may include four separated or two groups of first electrodes, i.e., the first electrodes 201 to 204 in FIG. 1. Each first electrode may correspond to a subpixel.

The light-emitting layer 60 may include at least two portion, each emitting light of a different color. Each portion of the light-emitting layer 60 may correspond to at least two first electrodes, and each first electrode may correspond to one subpixel. The first functional layer 40 and the second functional layer 80 may each be one of an electron functional layer and a hole functional layer.

Figure 8:
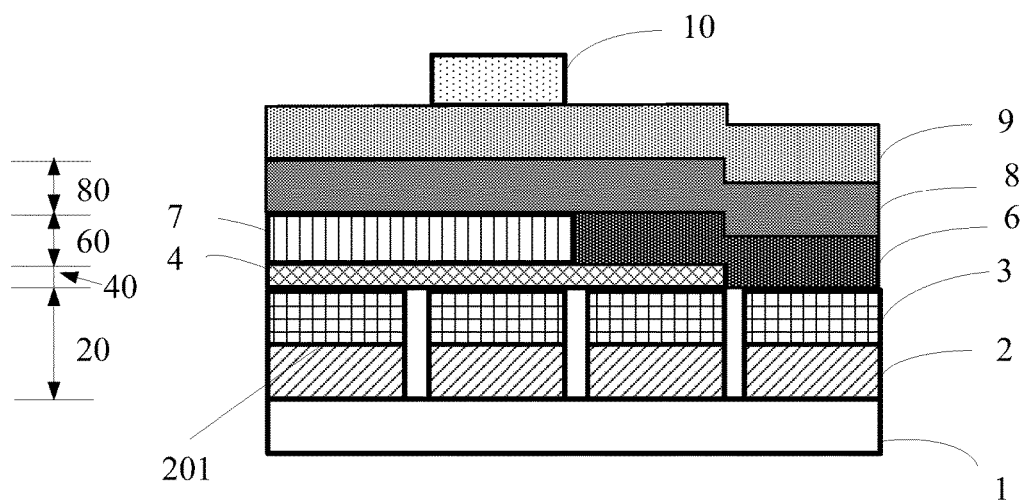

In one embodiment, the first functional layer 40 may include a first hole functional layer 4 and a second hole functional layer 5. The first hole functional layer 4 may be required for forming microcavities of different cavity lengths. The first hole functional layer 4 may correspond to at least two first electrodes and not correspond to at least one first electrode. The second hole functional layer 5 may be optional. In fact, the first hole functional layer 4 may be formed between any two adjacent layers above the reflective electrode layer 2 and under the light-emitting layer 60, as shown in FIGS. 1 to 4. The second hole functional layer 5 may also be formed between any two adjacent layers above the reflective electrode layer 2, as shown in FIGS. 1 to 4. The second hole functional layer 5 may also be absent, as shown in FIG. 8. In this case, the second functional layer 80 may only include a second electron functional layer 8 formed between the light-emitting layer 60 and the second electrode layer 9.

Figure 6:
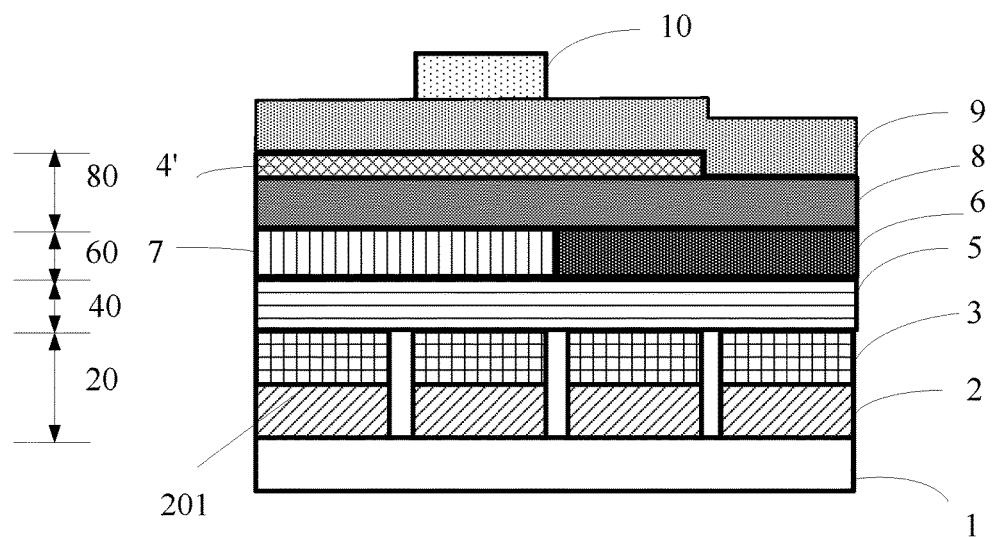
FIGS. 6 to 8 each illustrates another exemplary OLED pixel according to the disclosed embodiments of the present disclosure.
Figure 7:
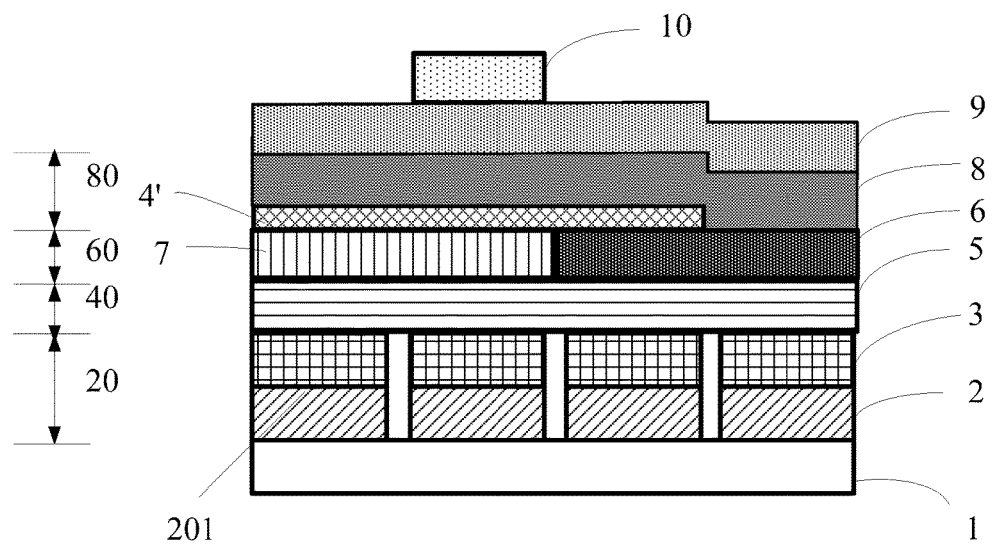

In some other embodiments, the second functional layer 80 may include a first electron functional layer 4' and a second electron functional layer 8 formed between the second electrode layer 9 and the light-emitting layer 60, as shown in FIGS. 6 and 7. The first electron functional layer 4' may be required for forming microcavities of different cavity lengths. The first electron functional layer 4' may correspond to at least two first electrodes and not correspond to at least one first electrode. The second electron functional layer 8 may be optional. In this case, the first functional layer 40 may not include a first hole functional layer 4 formed between the light-emitting layer 60 and the reflective electrode layer 2. For illustrative purposes, FIGS. 1 to 4 and FIGS. 6 to 8 are only exemplary. The specific position to form the second hole functional layer 5 may be determined according to different applications or designs.

The first hole functional layer 4 and/or the first electron functional layer 4' may have or may not have any other functions in the pixel 100 besides adjusting the distance between electrodes in the subpixels. That is, the first hole functional layer 4 and/or the first electron functional layer 4' may be used to adjust the distances between at least two first electrodes and the corresponding portions on the second electrode layer 9 such that the color of light emitting from the subpixels corresponding to the at least two first electrodes can be adjusted.

For illustrative purposes, in the embodiments of the present disclosure, the first electrode layer 20 may be the anode layer and the second electrode layer 9 may be the cathode layer. That is, the reflective electrode layer 2 may be a reflective anode layer 2. The transparent electrode layer 3 may be a transparent anode layer 3. The first electrode layer 20 may include four first electrodes 201 to 204, corresponding to four subpixels. The first functional layer 40 may include a first hole functional layer 4 and a second hole functional layer 5. The first hole functional layer 4 may correspond to at least two subpixels and may not correspond to at least one subpixel. The second electron functional layer 8 may be optional. The light-emitting layer 60 may include a first portion of light-emitting layer 6 and a second portion of light-emitting layer 7, each made of an organic material emitting light of a different color. The first portion of light-emitting layer 6 and the second portion of light-emitting layer 7 may each correspond to two subpixels.

In operation, a voltage may be applied across the first electrode layer 20 and the second electrode layer 9. Electrons may be generated in the first electrode layer 20 and holes may be generated in the second electrode layer 9. The generated electrons may be transported to the first portion of light-emitting layer 6 and the second portion of light-emitting layer 7 through the second functional layer 8, and the generated holes may be transported to the first portion of light-emitting layer 6 and the second portion of light-emitting layer 7 though the first functional layer 40. The electrons and the holes may recombine in the first portion of light-emitting layer 6 and the second portion of light-emitting layer 7 to emit light. The second functional layer 80 and first functional layer 40 may be used to facilitate the transportation of carriers and provide support to the corresponding electrodes.

Microcavity structures may be formed between electrodes for tuning the light of original colors or wavelengths emitted by the light-emitting materials to desired colors or wavelengths. For example, the reflective portion of a first electrode, the corresponding portion on the second electrode, and the layers or materials (including the light-emitting layer) in between may form a microcavity structure, shown as the element 12 (indicated in the dashed circle) in FIG. 1. The microcavity structure may correspond to a subpixel. The microcavity structure may be used to tune or change the original wavelength emitted by the light-emitting layer to a desired wavelength. The microcavity structure may be used alone or be incorporated with other structures to tune the original wavelength to another wavelength. The color of the subpixel, containing the microcavity structure, may be the color of light emitted by the microcavity structure. When a color conversion layer or structure is incorporated with the microcavity structure, the color of the subpixel may be color of light emitted after the color conversion.

In the microcavity structure 12, the desired wavelength may be dependent on, for example, the distance between the two reflective ends, e.g., electrodes, the properties of the materials between the electrodes, and the original wavelength emitted by the light-emitting layer. A microcavity structure 12 may be used to limit the wavelength of the light emitted by a light-emitting layer to have a narrower spectrum such that the color emitted by the subpixel is purer. When one light-emitting layer corresponds to more than one first electrode, more than one microcavity structures may be formed between the first electrodes and the corresponding portions on the second electrode layer. Each first electrode may correspond to one subpixel. The original wavelength emitted by the light-emitting layer may be between the longest wavelength and the shortest wavelength the microcavity structure 12 is able to emit. The light emitted by the microcavity structure 12 may be further adjusted by a color filter and/or by a color conversion layer. As shown in FIG. 1, a color conversion layer 10, positioned on a microcavity structure, may be further included for adjusting or changing the wavelength emitted by a microcavity structure to another wavelength. The color conversion layer may be made of any suitable material capable of converting wavelengths such as a quantum dot material and/or a photoluminescence material.

Specifically, as shown in FIG. 1, the plurality of first electrodes in the first electrode layer 20 (i.e., the anode layer) and the corresponding portions on the second electrode layer 9 (i.e., the cathode layer), may form a plurality of microcavity structures. The second portion of light-emitting layer 7 may correspond to two first electrodes 201 and 202. The first portion of light-emitting layer 6 may correspond to two first electrodes 203 and 204. Microcavity structures may form between each first electrode and the corresponding portion on the second electrode 9. Because the first hole functional layer 4 is formed on the first electrodes 201 to 203, the distance between the first electrodes corresponding to the first hole functional layer 4 (201 to 203) and the corresponding portion on the second electrode layer 9 may be different from the distance between the first electrode not corresponding to (204) the first hole functional layer 4 and the corresponding portion on the second electrode layer 9. In one embodiment, according to the working principles of microcavity structures, light emitted from the microcavity structures corresponding to the first electrode 201 and the second electrode 202 may be of the same color. A color conversion layer 10 may be positioned on the microcavity structure corresponding to the first electrode 201 or on the microcavity structure corresponding to the first electrode 202. The color conversion layer 10 may convert the light emitted from the corresponding microcavity structure to light of a different color. Further, light emitted from the microcaivty structure corresponding to the first electrodes 203 and the microcavity structure corresponding to the first electrode 204 may have different colors. Accordingly, the four subpixels of OLED pixel 100 may be used to emit light with four colors.

The first electrodes 201 to 204 may be formed or patterned by photolithography followed by an etch process. The first hole functional layer 4 may be formed or deposited by a suitable deposition process such as vacuum evaporation using a FMM. Assuming the smallest aperture width of the FMM is d, because the aperture width may correspond to the width of a portion of the light-emitting layer, a first electrode may thus have a width less than d/2, where d is a positive number. By taking advantage of photolithography, which is capable of forming smaller features than FMM technology, smaller subpixels of three primary colors may be formed using existing FMMs. Thus, color mixing between subpixels can be reduced or eliminated and display resolution can be improved. Further, fabrication yield of the display panel can be improved and the fabrication cost can be reduced.

The transparent electrode layer 3, formed on the reflective electrode layer 2 of the first electrodes 201 to 204, may be made of ITO. The transparent electrode layer 3 may be formed by a vacuum evaporation process, which is easy to control. The transparent electrode layer 3 may have substantial uniform thickness. The first hole functional layer 4 may be used to adjust the distance between a first electrode and the corresponding portion on the second electrode layer 9. The thickness of the first hole functional layer 4 may be controlled to a desired value through the deposition process. Because the first hole functional layer 4 does not correspond to at least one first electrode, i.e., only covers a portion of the first electrode layer 20, the distance between the electrodes may be adjusted at least in two microcavity structures so that the light emitted by at least two microcavity structures may have different colors. Further, by using a color conversion layer 10, the light emitted by other two microcavity structures can be different with each other. Thus, light of at least three different colors may be emitted by the subpixels corresponding to the microcavities without any additional etching process. The fabrication difficulty to form microcavity structures with varying lengths between electrodes can be greatly reduced.

In one embodiment, the second portion of light-emitting layer 7 may emit green light, and the first portion of light-emitting layer 6 may emit light blue light. The green and light blue colors may represent the original color emitted by each portion of the light-emitting layer. With the microcavity structure corresponding to first electrodes 203 and 204, the colors emitted by the two microcavities corresponding to the two first electrodes 203 to 204 may be green and blue. The color conversion layer 10 may be used to convert the green color emitted from the microcavity structure corresponding to the first electrode 202 to a red color. That is, the four subpixels of the OLED pixel shown in FIG. 1 may emit light of three colors, green, red, green, blue, arranged as GRGB.

It should be noted that, the arrangement of GRBR, the pentile arrangement, may only represent one application of the present disclosure. Materials capable of emitting light of other colors and/or one or more color conversion layers capable of converting a different color to another color may also be used for different applications or designs. The specific combination of the materials and the color conversion layer should not be limited by the specific embodiments described in the present disclosure.

Figure 2:
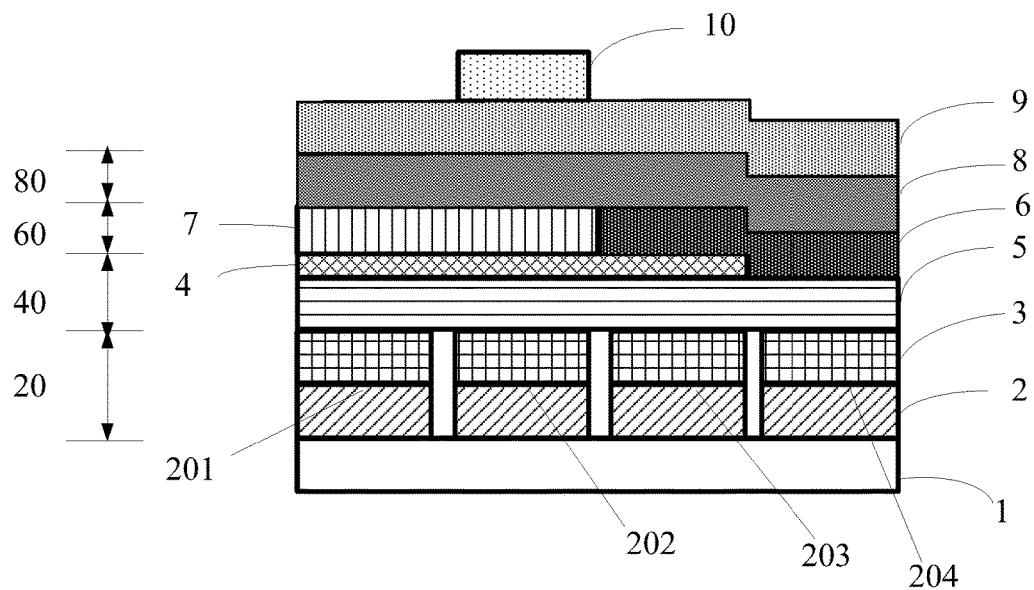

For illustrative purposes, in the OLED pixels shown in FIGS. 1 to 4, the first hole functional layer 4 may not correspond to the first electrode 204 and the distance between the first electrode 204 and the corresponding portion on the second electrode layer 9 may be reduced, shown as the kink or step in the figures. The first electrode (e.g., 204) may form a direct contact with the layer formed above for the electric current to flow through the subpixel. For example, in the OLED pixel shown in FIG. 1, the second hole functional layer 5 may fully contact the entire surface area of the first electrode 204. However, as shown in FIG. 1, because the thickness of the first hole functional layer 4 is sufficiently small, the second hole functional layer 5, the first portion of light-emitting layer 6, the electron functional layer 8, and the second electrode layer 9 may be sufficiently flat. The function and the mechanical strength of each layer are not affected. FIG. 2 illustrates another exemplary OLED pixel provided by the present disclosure. In FIG. 2, the second hole functional layer 5 may be positioned on the first electrode layer 20 directly, and the first hole functional layer 4 may be positioned between the first portion of light-emitting layer 6 and the second hole functional layer 5. In this case, the first portion of light-emitting layer 6 may be in contact with the second hole functional layer 5 so that the distance between the first electrode 204 and the corresponding portion on the second electrode layer 9 may be shorter than the distances between the another first electrode 201 (or 202 or 203) and the corresponding portion on the second electrode layer 9. According to the working principles of microcavity and previous description about the OLED pixel shown in FIG. 1, the subpixels formed in the OLED pixel may omit light of green, red, green, and blue, arranged as GRGB horizontally.

Figure 3:
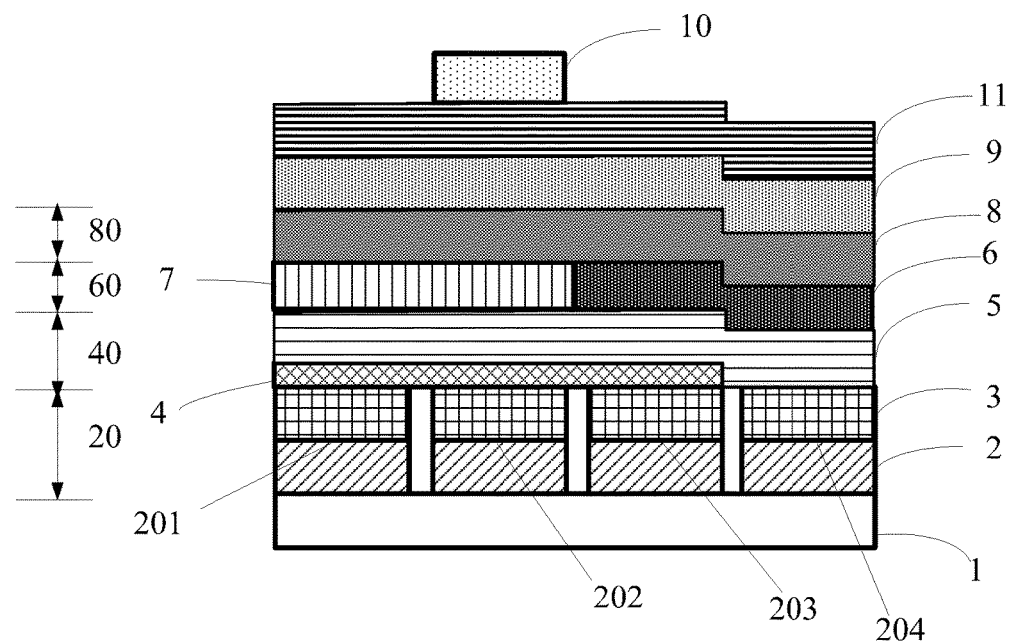
Figure 4:
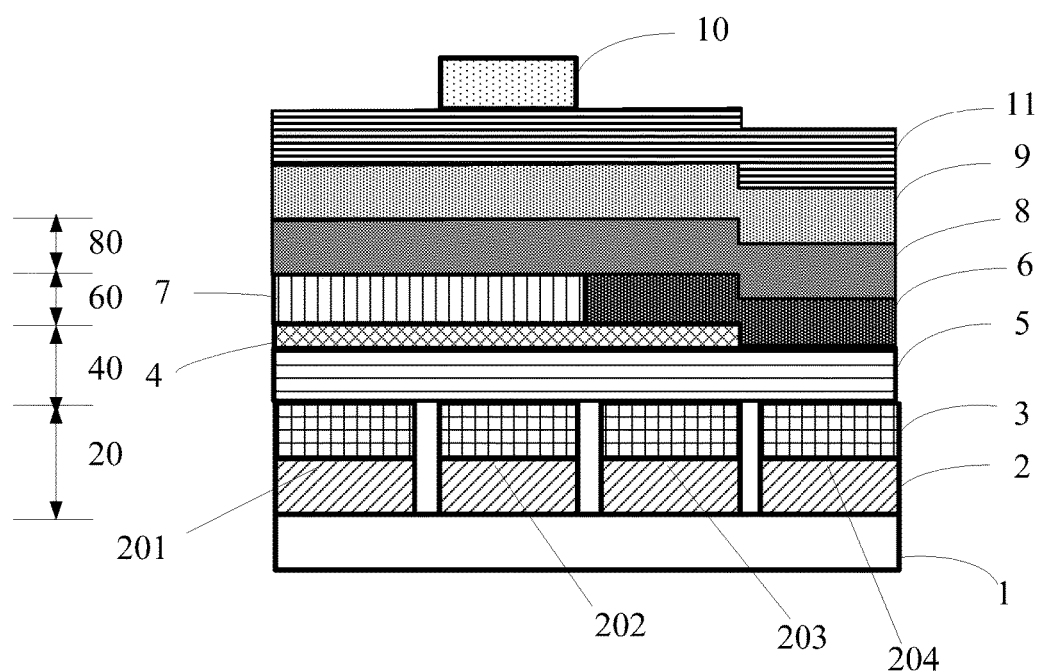

As shown in FIGS. 3 and 4, in some embodiments, an encapsulation layer 11 may be formed on the second electrode layer 9, and the color conversion layer 10 may be formed on the encapsulation layer 11. The encapsulation layer 11 may provide support and protection to prevent the second electrode layer 9 from being eroded or damaged in the formation process of the color conversion layer 10. The encapsulation layer 11 may not change the color emitted by each subpixel. The arrangement of other layers in the OLED pixels in FIGS. 3 and 4 are similar to the OLED pixels in FIGS. 1 and 2, and is not repeated herein. The subpixels in the OLED pixels in FIGS. 3 and 4 may each emit light of colors GRGB and GRGB, respectively. Based on the working principle of microcavities, the OLED pixels illustrated in FIGS. 1 to 4 and FIGS. 6 to 8 may all emit light of green, red, green, and blue, arranged as GRGB.

In practice, the disclosed OLED pixels may be repeatedly arranged horizontally. The repeated arranged OLED pixels and suitable circuits may form an OLED array substrate.

It should be noted that the OLED pixels in FIGS. 1 to 4 and FIGS. 6 to 8 are only for illustrative purposes. For example, each portion of the light-emitting layer 60 may correspond to more than two first electrodes to form more than two subpixels. More than two light-emitting layers in one pixel may also be used for emitting light of different colors. Portions of a light-emitting layer capable of emitting other colors of light may also be used to generate other desired colors. The thickness of the first hole functional layer 4 may be determined according to different applications or designs. The specific arrangement and choice of materials should not be limited to the embodiments of the present disclosure.

Another aspect of the present disclosure provides a method for forming the OLED pixel. The OLED pixel may be formed in an OLED array substrate.

Figure 5:
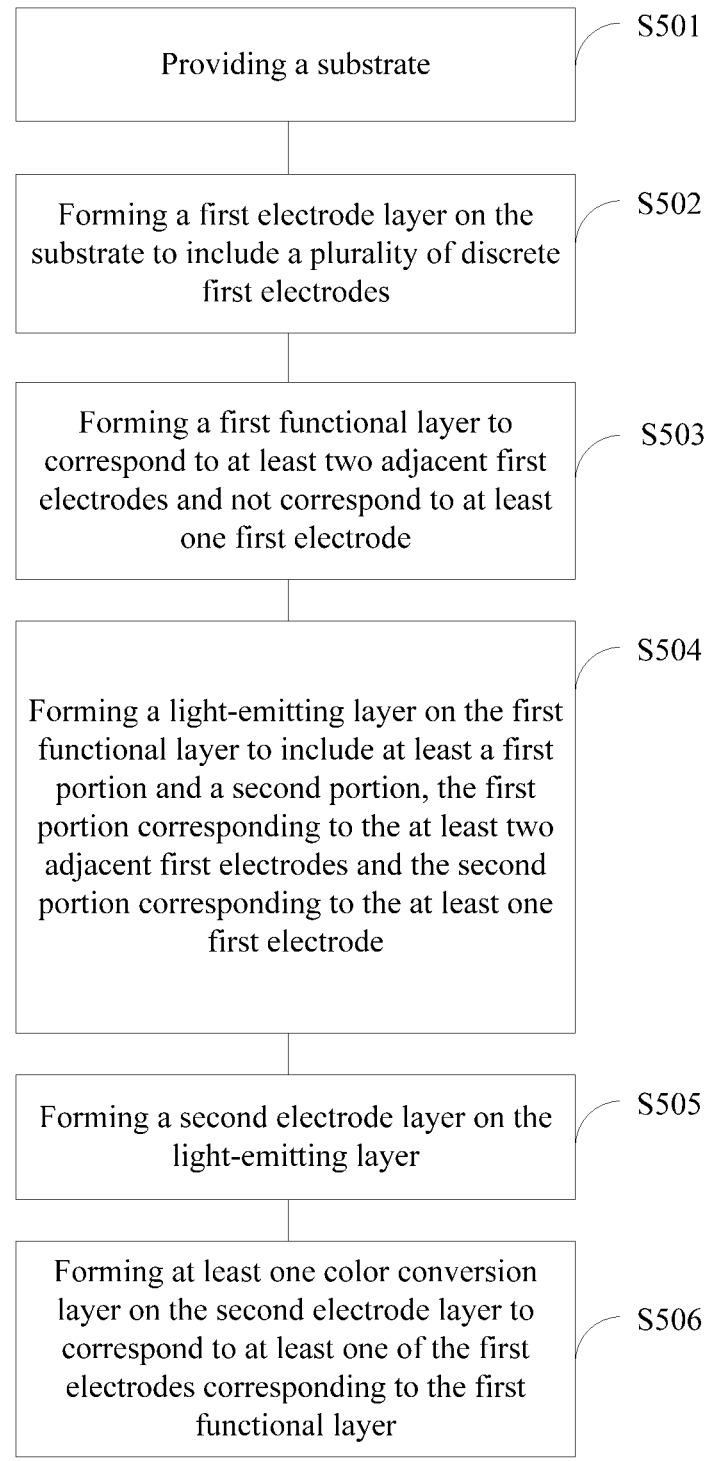
FIG. 5 illustrates an exemplary process for forming the OLED pixel according to the disclosed embodiments of the present disclosure.

FIG. 5 illustrates a process for forming the OLED pixel. The process may include steps S501 to S506.

In step S501, a substrate is provided.

Referring to FIG. 1, a substrate 1 may be provided. The substrate 1 may be made of any suitable materials such as glass and/or plastic.

In step S502, a first electrode layer is formed on the substrate, and the first electrode layer includes a plurality of separated first electrodes.

Referring to FIG. 1, the first electrode layer 20 may include a reflective electrode layer 2 and a transparent electrode layer 3. The reflective electrode layer 2 may be formed on the substrate 1, and the transparent electrode layer 3 may be formed on the reflective electrode layer 2. The reflective electrode layer 2 may be made of any suitable reflective material such as metal. The transparent electrode layer 3 may be made of ITO.

The reflective electrode layer 2 and the transparent electrode layer 3 may be formed by vacuum evaporation. The reflective electrode layer 2 may have a uniform thickness. The transparent electrode layer 3 may be formed on the reflective electrode layer 2 with a uniform thickness. The first electrode layer 20, i.e., the stacked reflective electrode layer 2 and the transparent electrode layer 3, may undergo a patterning process such as photolithography and a follow-up etch process to form the separated first electrodes. Each first electrode may include a reflective portion and a transparent portion. Each first electrode may be electrically insulated from the other first electrodes by air or by other suitable insulating materials such as resin. In one embodiment, four first electrodes 201 to 204 may be formed in one OLED pixel 100 and arranged in a horizontal direction.

In step S503, a first functional layer is formed to correspond to at least two adjacent first electrodes and not correspond to at least one first electrode.

Referring to FIG. 1, in one embodiment, the first functional layer 4 may be formed to correspond to three adjacent first electrodes 201 to 203 and not correspond to the first electrode 204. The orthogonal projection of the first functional layer 4 on the substrate 1 may cover the three adjacent first electrodes 201 to 203 and may not cover the first electrode 204. The first functional layer 4 may have a uniform thickness and desirable thickness.

The first functional layer 4 may be used to adjust a distance between a first electrode, e.g., the reflective portion of the first electrode, and the corresponding portion on the second electrode layer 9. The distance between a first electrode, corresponding to the first functional layer 4, and the corresponding portion on the second electrode layer 9 may be different from the distance between a first electrode, not corresponding to the first functional layer 4, and the corresponding portion on the second electrode layer 9. The thickness and the position of the first functional layer may be adjusted or determined according to different applications and/or designs. Thus, according to the working mechanism of microcavities, by combining the first functional layer with the light-emitting layer and/or a color conversion layer, subpixels emitting light of different colors can be formed.

The first functional layer 4 may be formed by vacuum evaporation using a FMM. The aperture width in the FMM for forming the first functional layer 4 may be larger than the width of at least two first electrodes. In one embodiment, as shown in FIG. 1, the aperture width to form the first functional layer 4 may be 3/2d, and the width of each first electrode may be less than 1/2d, taking into account the space between adjacent first electrodes.

In step S504, a light-emitting layer is formed to include a first portion of light-emitting layer and a second portion of light-emitting layer, where the first portion of light-emitting layer corresponds to the at least two adjacent first electrodes, and the second portion of light-emitting layer portion corresponds to the at least one first electrode.

Referring to FIG. 1, in one embodiment, the light-emitting layer 60 may be formed to correspond to least four first electrodes. The light-emitting layer 60 may include a first portion of light-emitting layer 6 and an adjacent second portion of light-emitting layer 7. The second portion of light-emitting layer portion 7 may correspond to the first electrodes 201 and 202. The first portion of light-emitting layer 6 may correspond to the first electrodes 203 and 204. In one embodiment, the orthogonal projection of the first portion of light-emitting layer 6 on the substrate may cover the first electrodes 203 and 204, and the orthogonal projection of the second portion of light-emitting layer 7 on the substrate may cover the first electrodes 201 and 202. The first electrodes 201 to 203 may correspond to the first functional layer 4 and the first electrode 204 may not correspond to the first functional layer 4. The first portion of light-emitting layer portion 6 and the second portion of light-emitting layer portion 7 may be made of light-emitting materials emitting light of different colors. Each first electrode may correspond to one subpixel.

The first portion of light-emitting layer portion 6 and the second portion of light-emitting layer portion 7 may be formed by vacuum evaporation using a FMM. The aperture of the FMM for forming the light-emitting layers may have a width of d, larger than twice the width of a first electrode, which is approximately d/2. In other words, assuming the d represents the smallest aperture of the existing FMM technology, by using photolithography to form the first electrodes, first electrodes with a width of less than half of the aperture width can be formed. Thus, by using the disclosed method, regardless of the aperture width of the FMM, subpixels with smaller widths can always be formed. The resolution of the corresponding display panel can thus be improved, and color mixing between adjacent subpixels can be reduced.

In some embodiment, a second functional layer 5 may be formed between the light-emitting layer 60 and the first electrode layer 20, as shown in FIGS. 1 to 4 and FIGS. 6 to 8. The width of the second functional layer 5 may the same as the width of the light-emitting layer 60. In certain other embodiments, no second functional layer 5 is formed, as shown in FIG. 8.

It should be noted that, because the first functional layer 4 can be formed between any two adjacent layers above the first electrode layer 20 and below the second electrode layer 9, step S503 and step S504 may switch. In one embodiment, step S503 may be implemented before step S504.

In step S505, a second electrode layer is formed on the light-emitting layer.

Referring to FIG. 1, the second electrode layer 9 may be formed on the light-emitting layer 60. The second electrode layer 9 may be a thin layer of metal with substantial transparency. The width of the second electrode layer 9 may be the same as the light-emitting layer 60. The second electrode layer 9 may be formed by vacuum evaporation. The orthogonal projection of each first electrode covers a corresponding portion on the second electrode layer 9. Each first electrode, the corresponding portion on the second electrode layer 9, and the corresponding portion of the light-emitting layer correspond to a subpixel.

In one embodiment, a third functional layer 8 may be formed between the light-emitting layer 60 and the second electrode layer 9 (e.g., as shown in FIG. 2). The width of the third functional layer 8 may be the same as the width of the second electrode layer 9.

In step S506, at least one color conversion layer is formed on the second electrode layer to correspond to at least one of the first electrodes corresponding to the first functional layer.

Referring to FIG. 1, the color conversion layer 10 may be formed on the second electrode layer 9 to convert the color of the light emitted from the portion of light emitting layer corresponding to the first electrode 202 to another color. The color conversion layer 10 may be formed by vacuum evaporation and patterned through a photolithography process. The color conversion layer 10 may be used to covert light emitted by the corresponding portion of the light-emitting layer, e.g., of a shorter wavelength, to light with a desired color, e.g., of a longer wavelength. The converted light may be the light emitted by the subpixel. For example, the color conversion layer 10 may convert the green light emitted by the second portion of light-emitting layer 7 to red light. The color conversion layer 10 may be made of suitable material capable of converting wavelengths such as quantum dot materials or photoluminescence materials.

In certain embodiments, an encapsulation layer 11 may be formed between the second electrode layer 9 and the color conversion layer 10, as shown in FIGS. 3 and 4. The encapsulation layer 11 may provide support and protect the second electrode layer 9 such that the second electrode layer 9 would not be damaged during the formation of the color conversion layer 10 or be eroded by the color conversion layer 10. The encapsulation layer 11 may be made of any suitable encapsulating materials such as plastic.

In one embodiment, the first electrode layer 20 may be the anode layer, and the first functional layer 4 and the second functional layer 5 may include the first hole functional layer 4 and the second hole functional layer 5. Accordingly, the second electrode layer 9 may be the cathode layer and the third functional layer 80 may be the electron functional layer 80. In certain other embodiments, the first electrode layer 20 may be the cathode layer, and the first functional layer 4 and the second functional layer 5 may be the first electron functional layer 4 and the second electron functional layer 5. Accordingly, the second electrode layer 9 may be the anode layer and the third functional layer 80 may be the hole functional layer 80. The electrodes may be made of suitable metals such as Mg and/or AlMg. The first hole functional layer 4 and the second hole functional layer 5 may be made of suitable organic materials such as 1,3-Bis(N-Carbozolyl) benzene. The electron functional layer 8 may be made of suitable organic materials such as Bathocuproine.

Referring to FIG. 1, the second electrode layer 9, the light-emitting layer 60, the first electrodes 201 to 204, and the color conversion layer 10 corresponding to the first electrode 202, may form four subpixels, where each first electrode may correspond to one subpixel. In one embodiment, the first portion of light-emitting layer 6 may be made of an organic material capable of emitting blue light. The second portion of light-emitting layer 7 may be made of an organic material capable of emitting green light. The color conversion layer 10 may be used to convert green light to red light. Thus, the OLED pixel may emit light of green, red, green, and blue (GRGB) colors.

By using the method provided by the present disclosure, the fabrication of the disclosed OLED pixel can be easier. The first electrode layer, including the reflective electrode layer and the transparent electrode layer, may both be formed using suitable deposition processes, such as evaporation deposition processes. The deposition rate and deposition thickness may be relatively easy to control. The reflective electrode layer and the transparent electrode layer may thus have uniform and controllable thickness. A patterning process, such as photolithography and a follow-up dry etch process, may be used to form separated first electrodes. The first hole functional layer, may be formed to correspond to a portion of the first electrodes. The first hole functional layer may be formed by an evaporation deposition process and may have uniform and controllable thickness. Because the first electrodes may have substantially the same thickness, by adjusting the thickness and position of the first hole functional layer and/or the thickness of the transparent electrode layer, the distances between the reflective portion of each first electrode and the corresponding portion on the second electrode layer may be adjusted to desired values without additional etching process. Compared to the method of etching the first electrodes, e.g., the transparent portion of the first electrode, to obtain different distances between the reflective portion of each first electrode and the corresponding portions on the second electrode layer, the disclosed method greatly reduced the fabrication difficulty, and the thicknesses of the first electrodes can be more accurately controlled. Damages to the first electrode layer due to any etching process can be avoided. The formed OLED pixel may thus have improved fabrication yield.

Further, the first electrodes each having a width of less than ½ of the width of the smallest FMM aperture can be formed using photolithography. Each first electrode may correspond to a subpixel. Vacuum evaporation may be used to form a functional layer with a uniform thickness corresponding to at least two of the adjacent first electrodes and not corresponding to at least one first electrode. The different distances between the reflective portion of each first electrode and the corresponding portion on the second electrode layer may enable the subpixels corresponding to the first electrodes to emit light of different colors. Thus, by combining difference in distances between electrodes and different light-emitting materials, the subpixels may be able to emit light of three primary colors.

Further, because photolithography can be used to form features with smaller widths than the existing FMM technology, photolithography may be used to form first electrodes each having a width less than ½ of the smallest aperture widths of the existing FMMs. Thus, regardless of the aperture widths of the existing FMMs, by using the disclosed method, first electrodes each having a width less than ½ of the smallest aperture widths of the existing FMMs can always be formed. The FMMs may be used to form light-emitting layers corresponding to at least two adjacent first electrodes. The arrangement described above, combined with the use of the first functional layer and a color conversion layer, may enable subpixels with a smaller size or width to be formed. Color mixing between subpixels may be reduced and display resolution of the corresponding display panel can be improved.

Further, in the disclosed OLED pixel, light-emitting layer capable of emitting light of different colors may be combined with a color conversion layer for emitting light of three primary colors. That is, for every four subpixels, only one color conversion layer is required for the emission of three primary colors. Compared to an existing white light OLED pixel, which emits light of different colors by incorporating color filters for each subpixel, less color filter or color conversion layer is required for the OLED pixel provided by embodiments of the present disclosure. The power consumption for the display panel incorporating the disclosed OLED pixel may be reduced.

Another aspect of the present disclosure provides a display panel.

The OLED pixels according to the present disclosure may be arranged repeatedly along the horizontal direction and the vertical direction to form a display panel. The display panel may include a plurality of the disclosed OLED pixels arranged in an array.

Another aspect of the present disclosure provides a display apparatus.

The display apparatus may incorporate the disclosed display panel. The display apparatus according to the embodiments of the present disclosure can be used in any product with display functions such as a television, an LCD display, an OLED display, an electronic paper, a digital photo frame, a mobile phone, a tablet computer, and a navigation device.

It should be understood that the above embodiments disclosed herein are exemplary only and not limiting the scope of this disclosure. Without departing from the spirit and scope of this invention, other modifications, equivalents, or improvements to the disclosed embodiments are obvious to those skilled in the art and are intended to be encompassed within the scope of the present disclosure.

What is claimed is:

1. An organic light-emitting pixel with four subpixels formed in two groups, each group having two adjacent subpixels, the organic light-emitting pixel comprising:
    a first electrode layer formed on a substrate, including a plurality of first electrodes, each first electrode corresponding to one of the subpixels;
    a second electrode layer;
    a first functional layer corresponding to three of the four subpixels but not a remaining one of the four subpixels, configured to adjust a distance between a first electrode of the plurality of first electrodes and the second electrode layer; and
    a light-emitting layer including a first portion and a second portion made of materials emitting light of different colors, the first portion corresponding to one of the two groups of subpixels and the second portion corresponding to another one of the two groups of subpixels.

2. The organic light-emitting pixel according to claim 1, wherein the first functional layer is formed between the first electrode layer and the light-emitting layer.

3. The organic light-emitting pixel according to claim 2, wherein the first functional layer is a hole functional layer.

4. The organic light-emitting pixel according to claim 1, wherein the first functional layer is formed between the second electrode layer and the light-emitting layer.

5. The organic light-emitting pixel according to claim 4, wherein the first functional layer is an electron functional layer.

6. The organic light-emitting pixel according to claim 1, wherein a subpixel of the three subpixels corresponding to the first functional layer includes a color conversion layer formed on the second electrode layer for converting the color of light.

7. The organic light-emitting pixel according to claim 6, wherein the subpixel including the color conversion layer belongs to one of the two groups of subpixels, and the subpixel not corresponding to the first functional layer belongs to another one of the two groups of subpixels.

8. The organic light-emitting pixel according to claim 1, wherein a width of the first portion of the light-emitting layer is greater than twice a width of the first electrode; and a width of the second portion of the light-emitting layer is greater than twice the width of the first electrode.

9. The organic light-emitting pixel according to claim 1, wherein each first electrode includes a reflective portion formed on the substrate and a transparent portion formed on the reflective portion.

10. The organic light-emitting pixel according to claim 9, wherein the transparent portion of each first electrode has a same thickness.

11. The organic light-emitting pixel according to claim 6, wherein:
    the first portion of the light-emitting layer is configured to emit green light; the second portion of the light-emitting layer is configured to emit blue light; and the color conversion layer is configured to convert green light to red light.

12. A display panel, including the organic light-emitting pixel of claim 1.

13. The organic light-emitting pixel according to claim 1, wherein an orthogonal projection of the first portion on the substrate does not overlap an orthogonal projection of the second portion on the substrate.

14. The organic light-emitting pixel according to claim 1, wherein a material of the first portion is uniform across the entire first portion and a material of the second portion is uniform across the entire second portion.

15. A method for fabricating an organic light-emitting pixel with four subpixels formed in two groups, each group having two adjacent subpixels, the method comprising:
    forming a first electrode layer on a substrate with a plurality of first electrodes, each first electrode corresponding to one of the four subpixels;
    forming a first functional layer corresponding to three of the four subpixels but not a remaining one of the four subpixels;
    forming a light-emitting layer including a first portion and a second portion made of materials emitting light of different colors, the first portion corresponding to one of the two groups of subpixels and the second portion corresponding another one of the two groups of subpixels; and
    forming a second electrode layer,
    wherein the first functional layer is configured to adjust a distance between a first electrode of the plurality of first electrodes and the second electrode layer.

16. The method according to claim 15, wherein the first functional layer is formed between the first electrode layer and the light-emitting layer.

17. The method according to claim 16, wherein the first functional layer is a hole functional layer.

18. The method according to claim 15, wherein the first electrodes are formed by vacuum evaporation process followed by a patterning process and the first functional layer is formed by a vacuum evaporation process.

19. The method according to claim 15, further including forming at least one color conversion layer on the second electrode layer for converting a color of light emitted by a corresponding portion of the light-emitting layer to light of another color.

20. A display apparatus, including the display panel of claim 12.

* * * * *